(12) United States Patent
Narayen et al.

(10) Patent No.: US 9,007,079 B2
(45) Date of Patent: Apr. 14, 2015

(54) SYSTEM AND METHOD FOR COMPENSATING MEASURED IDDQ VALUES

(71) Applicant: Nvidia Corporation, Santa Clara, CA (US)

(72) Inventors: Dushyant Narayen, Santa Clara, CA (US); Nerinder Singh, San Jose, CA (US); Gunaseelan Ponnuvel, Santa Clara, CA (US); Hemant Kumar, Santa Clara, CA (US); Luai Nasser, Santa Clara, CA (US); Craig Nishizaki, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 342 days.

(21) Appl. No.: 13/667,872

(22) Filed: Nov. 2, 2012

(65) Prior Publication Data

US 2014/0125364 A1    May 8, 2014

(51) Int. Cl.
*G01R 31/26* (2014.01)
*G01R 31/30* (2006.01)

(52) U.S. Cl.
CPC .................................. *G01R 31/3008* (2013.01)

(58) Field of Classification Search
USPC ............. 324/750.01, 750.02, 750.03, 762.01, 324/762.09
See application file for complete search history.

(56) References Cited

U.S. PATENT DOCUMENTS

2006/0250152 A1* 11/2006 Rius Vazquez et al. ........ 324/765
2013/0061196 A1*  3/2013 Cheng et al. ................... 716/132

* cited by examiner

*Primary Examiner* — Vincent Q Nguyen

(57) ABSTRACT

An IDDQ test system and method that, in one embodiment, includes 1) an empirical extraction subsystem operable to generate an IDDQ versus temperature model for a given semiconductor device design, 2) an automatic test equipment (ATE) test subsystem operable to obtain a measured IDDQ value ($IDDQ_m$) at a measured temperature ($T_m$) for a specific semiconductor device embodying the given semiconductor device design, the measured temperature ($T_m$) obtained within 5 seconds of obtaining the measured IDDQ value ($IDDQ_m$), and 3) a scaling subsystem operable to scale the measured IDDQ value ($IDDQ_m$) at the measured temperature ($T_m$) to a compensated IDDQ value ($IDDQ_c$) at a desired temperature ($T_d$) using the IDDQ versus temperature model.

20 Claims, 3 Drawing Sheets

SYSTEM AND METHOD FOR COMPENSATING MEASURED IDDQ VALUES

TECHNICAL FIELD

This application is directed, in general, to IDDQ values and, more specifically, to a system and method for compensating measured IDDQ values.

BACKGROUND

Wafer fabrication is the process by which semiconductor devices are manufactured. It is basically a process by which a silicon wafer substrate is repeatedly coated, etched and rinsed to form such devices. The wafer is then cut to separate the semiconductor devices, which may then be molded into packages for mounting on circuit boards or the like.

Wafer fabrication is a multivariate process and subject to manufacturing defects/variations, however slight they may be. A highly competitive wafer fabrication industry pays a great deal of attention to the occurrence and impact of these defects/variations. In certain situations, such defects/variations lead to the semiconductor devices being scrapped entirely. In other situations, the defects/variations lead to usable devices, but depending on the significance of the defects/variations, for a variety of different high to low importance applications.

SUMMARY

One aspect provides an IDDQ test system. The IDDQ test system, in one embodiment, includes 1) an empirical extraction subsystem operable to generate an IDDQ versus temperature model for a given semiconductor device design, 2) an automatic test equipment (ATE) test subsystem operable to obtain a measured IDDQ value ($IDDQ_m$) at a measured temperature ($T_m$) for a specific semiconductor device embodying the given semiconductor device design, the measured temperature ($T_m$) obtained within 5 seconds of obtaining the measured IDDQ value ($IDDQ_m$), and 3) a scaling subsystem operable to scale the measured IDDQ value ($IDDQ_m$) at the measured temperature ($T_m$) to a compensated IDDQ value ($IDDQ_c$) at a desired temperature ($T_d$) using the IDDQ versus temperature model.

Another aspect provides a method for binning a semiconductor device. The method for binning the semiconductor device, in this aspect, includes: 1) measuring an IDDQ value ($IDDQ_m$) at a measured temperature ($T_m$) for a specific semiconductor device embodying a given semiconductor device design, the measured temperature ($T_m$) obtained within 5 seconds of obtaining the measured IDDQ value ($IDDQ_m$), 2) scaling the measured IDDQ value ($IDDQ_m$) at the measured temperature ($T_m$) to a compensated IDDQ value ($IDDQ_c$) at a desired temperature ($T_d$) using an empirically generated IDDQ versus temperature model for the given semiconductor device design, and 3) sorting the specific semiconductor device based upon the compensated IDDQ value ($IDDQ_c$).

Yet another aspect provides a method for compensating an IDDQ value. The method for compensating the IDDQ value, in this aspect, includes: 1) empirically extracting an IDDQ versus temperature model for a given semiconductor device design, 2) measuring an IDDQ value ($IDDQ_m$) at a measured temperature ($T_m$) for a specific semiconductor device embodying the given semiconductor device design, the measured temperature ($T_m$) obtained within 5 seconds of obtaining the measured IDDQ value ($IDDQ_m$), and 3) scaling the measured IDDQ value ($IDDQ_m$) at the measured temperature ($T_m$) to a compensated IDDQ value ($IDDQ_m$) at a desired temperature ($T_d$) using the IDDQ versus temperature model.

BRIEF DESCRIPTION

Reference is now made to the following descriptions taken in conjunction with the accompanying drawings, in which.

DETAILED DESCRIPTION

Figure 1:
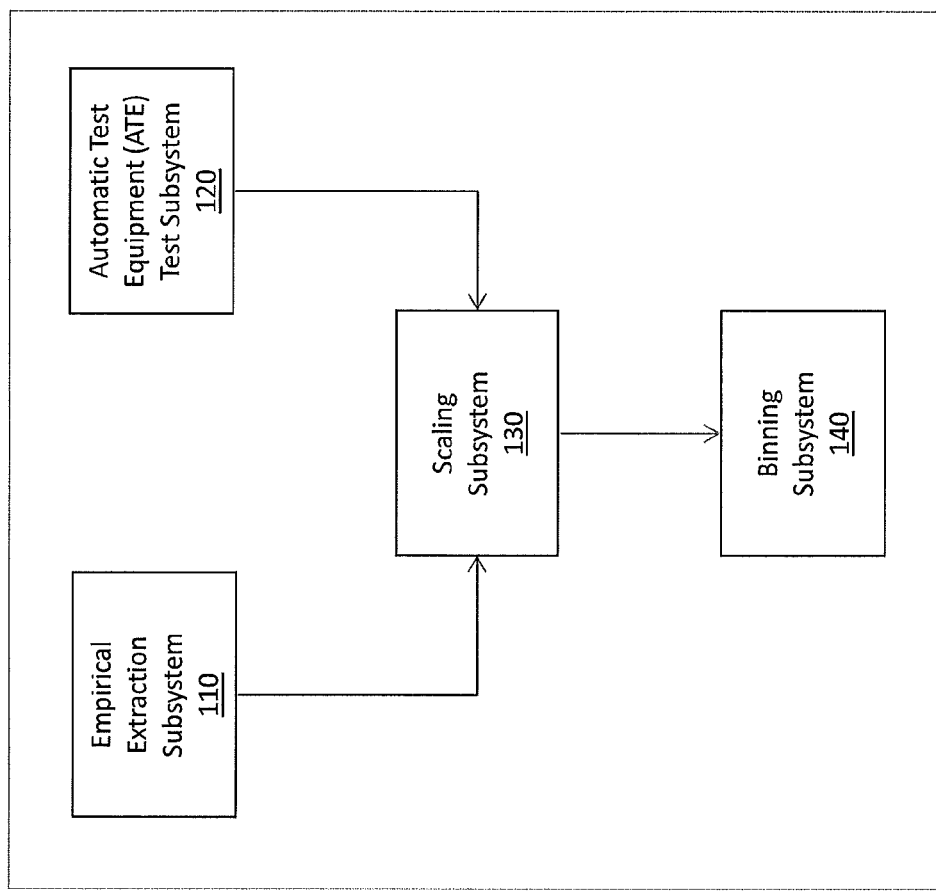
FIG. 1 is a block diagram of one embodiment of a IDDQ test system in which one or more aspects of the disclosure may be implemented.

Before describing various embodiments of a IDDQ test system or method introduced herein, IDDQ processes and IDDQ testing will be generally described.

Traditional wafer fabrication yield is determined by evaluating semiconductor devices, or in certain situations semiconductor wafers including a plurality of semiconductor devices, and allocating each to a performance bin that is characterized by the products or applications that the semiconductor devices are valid and qualified to serve. Performance bins are generally formed to fit a specific product and are often defined with upper and lower bounds on a physical, often electrical, characteristic.

IDDQ is one such metric (e.g., electrical characteristic) that is analyzed for binning purposes. IDDQ tests for the presence of manufacturing faults, and typically relies on measuring the supply current (Idd) in the quiescent state (e.g., when the circuit is not switching and inputs are held at static values). IDDQ uses the principle that in a correctly operating quiescent CMOS integrated circuit, there is no static current path between the power supply and ground, except for a small amount of leakage.

The present disclosure is based, at least in part, on the recognition that IDDQ measurements are heavily dependent on the automatic test equipment (ATE) temperature control. For example, since circuit leakage increases (e.g., exponentially) with temperature, differences in temperature significantly affect IDDQ measurements. The inability to obtain precise and timely IDDQ measurements, at least as recognized by the present disclosure, can result in a semiconductor device being incorrectly binned.

It is fundamentally realized herein that to employ IDDQ results appropriately, and have accurate IDDQ information to make an informed binning decision, the IDDQ measurements should be conducted at a target IDDQ temperature value (e.g., a maximum temperature value at which the semiconductor device will typically operate) for a given semiconductor device. However, it is further realized that it is extremely difficult to take such IDDQ measurements at exactly the target IDDQ temperature values.

It is also fundamentally realized herein that an IDDQ versus temperature model (e.g., correlation) exists between measured IDDQ values ($IDDQ_m$) at a measured temperature ($T_m$), and target IDDQ values ($IDDQ_T$) at a target temperature ($T_t$), for a given semiconductor device design. It is further realized herein that a novel, advanced IDDQ test system can exploit these correlations by performing an analysis and forming the predictions necessary to generate a compensated IDDQ value ($IDDQ_c$) at a desired temperature ($T_d$) from the measured IDDQ value ($IDDQ_m$) at a measured temperature ($T_m$). In an advantageous scenario, the compensated IDDQ value ($IDDQ_c$) at the desired temperature ($T_d$) tracks the target IDDQ value ($IDDQ_t$) at the target temperature ($T_t$), and thus the compensated IDDQ value ($IDDQ_c$) may be used to accurately bin the semiconductor device.

It is realized herein that for certain semiconductor devices, an exponential relationship exists between IDDQ and temperature. For example, the exponential relationship may be a single point measurement exponential fit approximation, which is based on a fixed coefficient using an exponential fit model. In one example, the single point measurement exponential fit approximation may use an equation: $IDDQ_c = (IDDQ_m) * C^{(Tc-Tm)}$, wherein $IDDQ_m$ is the measured IDDQ value, C is a calibration coefficient, $T_d$ is the temperature at which the IDDQ is desirably measured, $T_m$ is the actual temperature that the $IDDQ_m$ is measured, and $IDDQ_c$ is the compensated IDDQ value. Accordingly, at least for these semiconductor devices, the IDDQ versus temperature model may be based upon an exponential approximation of a correlation among IDDQ values measured over a range of temperatures for the given semiconductor device design. Moreover, results show that this approach provides a significant improvement in the accuracy of the compensated IDDQ value ($IDDQ_c$).

It is realized herein that for certain other semiconductor devices, a quadrilateral relationship exists between IDDQ and temperature. Accordingly, at least for these semiconductor devices, the IDDQ versus temperature model may be based upon a quadrilateral approximation of a correlation among IDDQ values measured over a range of temperatures for the given semiconductor device design.

It is realized herein that the desired temperature ($T_d$) is, in one embodiment, equal to the target temperature ($T_t$). The phrase "target temperature ($T_t$)", as used herein, is intended to refer to the maximum temperature value at which the semiconductor device will typically operate, and therefore the most relevant temperature for analyzing the IDDQ value for a given semiconductor device. The target temperature ($T_t$), depending on the given semiconductor device, often ranges from about 75 degrees centigrade to about 110 degrees centigrade, but may also be outside of this range. In many embodiments, the target temperature ($T_t$) is within a smaller range of about 102 degrees centigrade to about 108 degrees centigrade.

It is realized herein that the measured temperature ($T_m$), in one embodiment, should closely approximate the actual temperature of the semiconductor device at the point that the measured IDDQ value ($IDDQ_m$) is obtained. Accordingly, the measured temperature ($T_m$) might be obtained within about 5 seconds of obtaining the measured IDDQ value ($IDDQ_m$). In yet another embodiment, the measured temperature ($T_m$) might be obtained within about 1 second of obtaining the measured IDDQ value ($IDDQ_m$). In certain other embodiments wherein very precise software scripts are in use, the measured temperature ($T_m$) might be obtained within about 100 milliseconds of obtaining the measured IDDQ value ($IDDQ_m$). Presumably, in these novel scenarios, the measured temperature ($T_m$) might only differ from the actual temperature by a very slight amount.

Having generally described IDDQ test processes and IDDQ testing, various embodiments of the IDDQ test system and method introduced herein will be described.

FIG. 1 is a block diagram of one embodiment of an IDDQ test system 100 in which one or more aspects of the disclosure may be implemented. The IDDQ test system 100 initially includes an empirical extraction subsystem 110. The empirical extraction subsystem 110, in the illustrated embodiment, is operable to generate an IDDQ versus temperature model for a given semiconductor device. The empirical extraction subsystem 110, in this embodiment, need not include expensive ATE equipment. In contrast, the empirical extraction subsystem 110 need only generate the IDDQ versus temperature model using a controlled lab environment. A controlled lab environment, as understood herein, is a lab environment where the user has confidence in the temperature measurements, and a lab environment wherein ample experimental data points have been generated to extract the fit coefficient with high confidence.

The IDDQ test system 100 of FIG. 1 may further include an automatic test equipment (ATE) test subsystem 120. The ATE test subsystem 120, in accordance with this disclosure, is operable to obtain a measured IDDQ value ($IDDQ_m$) at a measured temperature ($T_m$) for a specific semiconductor device embodying the given semiconductor device design. Accordingly, not only is the ATE test subsystem 120 configured to obtain a measured IDDQ value ($IDDQ_m$), it must do so at a measured temperature ($T_m$) that closely approximates the actual temperature of the semiconductor device at the point that the measured IDDQ value ($IDDQ_m$) is obtained. For example, the measured temperature ($T_m$) might be obtained within about 100 milliseconds of obtaining the measured IDDQ value ($IDDQ_m$). To accommodate this desire, one embodiment has the temperature test equipment integrated within the ATE test subsystem 120, and a software script ensuring that the measured temperature ($T_m$) is obtained within a specified amount of time of obtaining the measured IDDQ value ($IDDQ_m$). In one preferred embodiment, the measured temperature ($T_m$) is taken within about 10 degrees centigrade of the target temperature ($T_t$) for a given semiconductor device. Nevertheless, it is understood that this may be difficult in certain circumstances, and thus the disclosure contained herein should not be limited to such accuracy.

The IDDQ test system 100 of FIG. 1 may further include a scaling subsystem 130. The scaling subsystem 130, in this embodiment, accepts inputs from the empirical extraction subsystem 110 and the ATE test subsystem 120. In the disclosed embodiment, the scaling subsystem 130 is operable to use the IDDQ versus temperature model generated and obtained by the empirical extraction subsystem 110 to scale the measured IDDQ value ($IDDQ_m$) at the measured temperature ($T_m$) obtained from the ATE test subsystem 120, for example to generate a compensated IDDQ value ($IDDQ_c$) at a desired temperature ($T_d$).

The IDDQ test system 100 of FIG. 1 may further include a binning subsystem 140. The binning subsystem 140 is operable to sort the specific semiconductor device tested by the ATE test subsystem 120 based upon the compensated IDDQ value ($IDDQ_c$) obtained by the scaling subsystem 130. The binning subsystem 140 need not physically bin the specific semiconductor device tested by the ATE test subsystem 120, but might only classify the specific semiconductor device tested by the ATE test subsystem 120 based upon the compensated IDDQ value ($IDDQ_c$). Nevertheless, in another embodiment, the binning subsystem 140 classifies and then physically bins the specific semiconductor device tested by the ATE test subsystem 120 based upon the compensated IDDQ value ($IDDQ_c$).

An IDDQ test system, such as the IDDQ test system 100, may be employed to test and classify a variety of different semiconductor device designs. For instance, the empirical extraction subsystem 110 might obtain different IDDQ versus temperature models for a plurality of different semiconductor device designs, thereby creating a library of IDDQ versus temperature models across semiconductor design type. In this embodiment, the scaling subsystem 130 could quickly access the empirical extraction subsystem 110 library, as opposed to generating a new IDDQ versus temperature model for every test.

Figure 2:
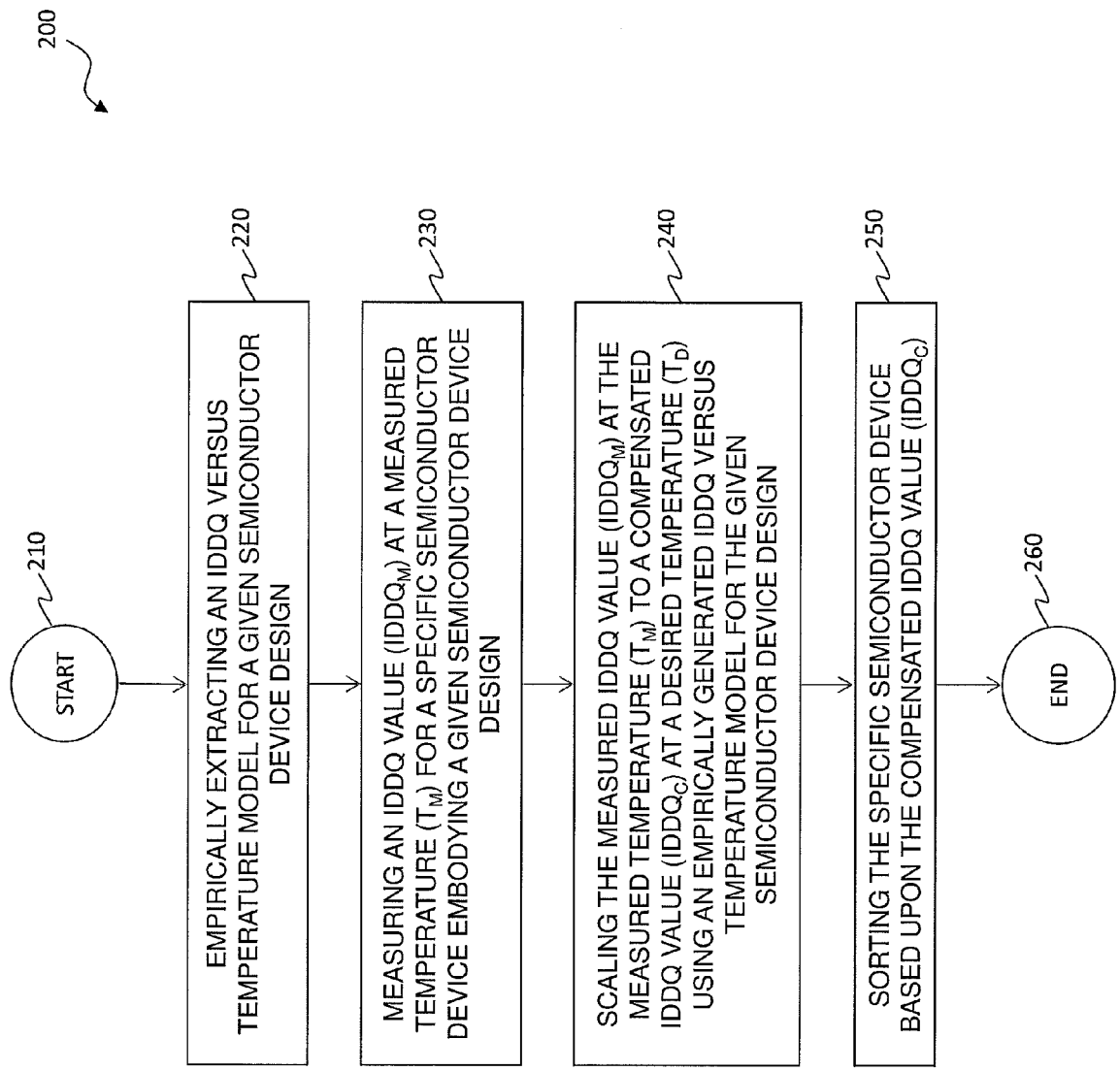
FIG. 2 is a flow diagram of one embodiment of a method for binning a semiconductor device.

FIG. 2 is a flow diagram 200 of one embodiment of a method for binning a semiconductor device. The method for binning the semiconductor device begins in a start step 210 and continues on to step 220 where an IDDQ versus temperature model is generated (e.g., empirically extracted) for a given semiconductor device design. The IDDQ versus temperature model may be generated for a single semiconductor device design of importance, or alternatively may be generated for a plurality of semiconductor device designs of importance. In one example, the IDDQ versus temperature models are generated for all semiconductor devices designs that a particular manufacturer tests. Moreover, the IDDQ versus temperature models need not be generated by the company doing the subsequent testing (e.g., steps 230 and 240), but may be obtained or purchased from an unrelated third party. Nevertheless, other known embodiments exist wherein the same company generating the IDDQ versus temperature model is also doing the subsequent testing (e.g., steps 230 and 240).

As discussed above, the model for IDDQ versus temperature may be empirically extracted using a variety of different approximations, often times depending on the device design and accuracy issues. For example, in one embodiment, the IDDQ versus temperature model is generated based upon an exponential approximation of a correlation among IDDQ values measured over a range of temperatures for the given semiconductor device design generated. For example, a single point measurement exponential fit approximation might be employed. In yet another embodiment, the IDDQ versus temperature model is generated based upon a quadrilateral approximation of a correlation among IDDQ values measured over a range of temperatures for the given semiconductor device design.

In a step 230, an IDDQ value ($IDDQ_m$) at a measured temperature ($T_m$) is obtained for a specific semiconductor device embodying a given semiconductor device design. As discussed above, the measured temperature ($T_m$), in one embodiment, should closely approximate the actual temperature of the semiconductor device at the point that the measured IDDQ value ($IDDQ_m$) is obtained. Accordingly, the measured temperature ($T_m$) might be obtained within about 5 seconds, or less, of obtaining the measured IDDQ value ($IDDQ_m$). In yet another embodiment, the measured temperature ($T_m$) might be obtained within about 1 second, or even within about 100 milliseconds, of obtaining the measured IDDQ value ($IDDQ_m$). It should be noted that step 230 need not occur after step 220. In other embodiments, step 220 is conducted concurrently with, or even after, step 230.

Having the information obtained in step 220 and step 230, the measured IDDQ value ($IDDQ_m$) at the measured temperature ($T_m$) may be scaled to a compensated IDDQ value ($IDDQ_c$) at a desired temperature ($T_d$), in a step 240. Often, the IDDQ versus temperature model, as well as the desired temperature ($T_d$) differs across different semiconductor device designs. Accordingly, it is important to have an accurate IDDQ versus temperature model for a given semiconductor device design, but also know the desired temperature ($T_d$) for that given semiconductor device design, such that the most accurate compensated IDDQ value ($IDDQ_c$) may be obtained. In one exemplary embodiment, the desired temperature ($T_d$) is the target temperature ($T_t$).

In the embodiment wherein the single point measurement exponential fit approximation is used to obtain the IDDQ versus temperature model, the compensated IDDQ value ($IDDQ_c$) might be obtained using the equation: $IDDQ_c = IDDQ_m * C^{(Td-Tm)}$, where $IDDQ_m$ is the measured IDDQ value, C is a calibration coefficient, $T_d$ is the temperature at which the IDDQ is desirably measured, $T_m$ is the actual temperature that the $IDDQ_m$ is measured, and $IDDQ_c$ is the compensated IDDQ value.

In a step 250, the compensated IDDQ value ($IDDQ_c$) obtained in step 240 may be used to sort the specific semiconductor device tested in step 230. Those skilled in the art, given the disclosures herein, would understand the process for sorting the specific semiconductor device, at least once that skilled person was provided the compensated IDDQ value ($IDDQ_c$) calculated herein.

The flow diagram 200 is illustrated as a method for binning a semiconductor device. Nevertheless, embodied within the method for binning the semiconductor device is a method for compensating an IDDQ value. For example, steps 220, 230 and 240, among possible others, might embody a method for compensating an IDDQ value in accordance with the disclosure.

Figure 3:
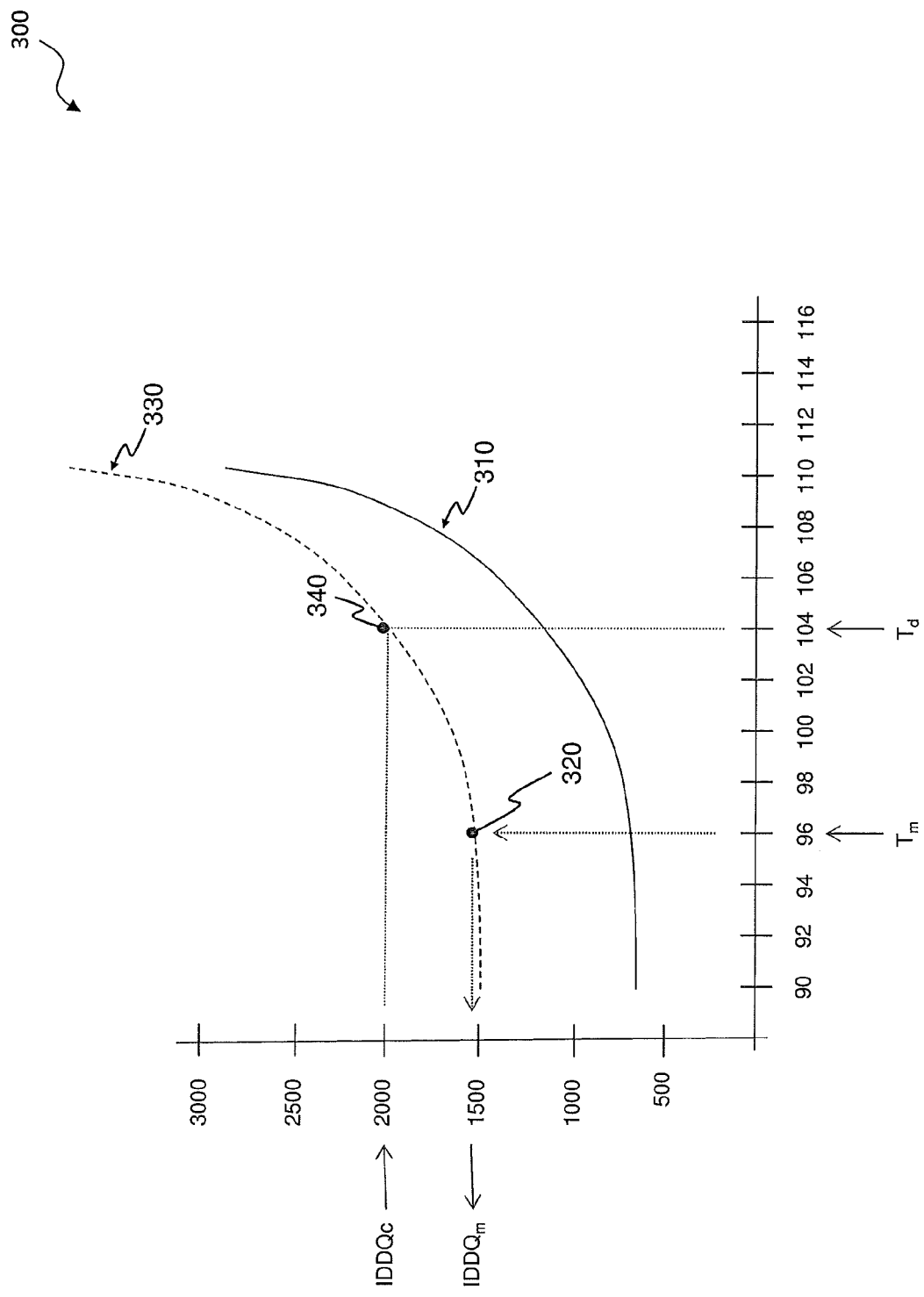
FIG. 3 is a graph illustrating one example for scaling the measured IDDQ value ($IDDQ_m$) at the measured temperature ($T_m$) to obtain a compensated IDDQ value ($IDDQ_c$) at a desired temperature ($T_d$).

Turning FIG. 3, illustrated is a graph 300 illustrating one example for scaling a measured IDDQ value ($IDDQ_m$) at a measured temperature ($T_m$) to obtain a compensated IDDQ value ($IDDQ_c$) at a desired temperature ($T_d$). The graph 300 includes an IDDQ versus temperature model approximation 310. The IDDQ versus temperature model approximation 310, in the embodiment shown, is an exponential linear approximation of a correlation among IDDQ values measured over a range of temperatures for a given semiconductor device design. The IDDQ versus temperature model 310 might be obtained by an empirical extraction subsystem, such as the empirical extraction subsystem 110 illustrated and discussed with regard to FIG. 1 above, in for example the aforementioned step 220.

The graph 300 further includes a point 320, which represents a measured IDDQ value ($IDDQ_m$) at a measured temperature ($T_m$) for a specific semiconductor device embodying a given semiconductor device design, such as might be obtained by the ATE test subsystem 120, in for example the aforementioned step 230. In the illustrated graph 300, the point 320 represents a measured IDDQ value ($IDDQ_m$) of about 1500 at a measured temperature ($T_m$) of about 96 degrees centigrade.

Knowing the IDDQ versus temperature model approximation 310, and the point 320 representing the measured IDDQ value ($IDDQ_m$) at the measured temperature ($T_m$), a compensated IDDQ value ($IDDQ_c$) for a desired temperature ($T_d$) may be obtained, for example by interpolation. The interpolation is illustrated, at least in this embodiment, by overlaying the IDDQ versus temperature model approximation 310 on the point 320, which is illustrated by dotted line 330.

A point 340 may then be found on the dotted line 330 representing the desired temperature ($T_d$), which may then be follow across to find the compensated IDDQ value ($IDDQ_c$). In this embodiment, the desired temperature ($T_d$) is about 104 degrees centigrade, and the resulting compensated IDDQ value ($IDDQ_c$) is about 2000. Accordingly, in this embodiment, a measured IDDQ value ($IDDQ_m$) of about 1500 at a measured temperature ($T_m$) of about 96 degrees centigrade, scales to a compensated IDDQ value ($IDDQ_c$) of about 2000 at a desired temperature ($T_d$) of about 104 degrees centigrade. The compensated IDDQ value ($IDDQ_c$) of about 2000 might then be used for binning decisions.

The graph 300 illustrates but one process for calculating a compensated IDDQ value ($IDDQ_c$). Rarely, will the calculation physically occur using a graph, such as graph 300. In the majority of circumstances, computer hardware and software scripts will be employed to quickly provide the compensated IDDQ value (IDDQ$_c$), based upon the known desired temperature (T$_d$), measured IDDQ value (IDDQ$_m$) at the measured temperature (T$_m$), and the IDDQ versus temperature model.

Those skilled in the art to which this application relates will appreciate that other and further additions, deletions, substitutions and modifications may be made to the described embodiments.

What is claimed is:

1. An IDDQ test system, comprising:
    an empirical extraction subsystem operable to generate an IDDQ versus temperature model for a given semiconductor device design;
    an automatic test equipment (ATE) test subsystem operable to obtain a measured IDDQ value (IDDQ$_m$) at a measured temperature (T$_m$) for a specific semiconductor device embodying the given semiconductor device design, the measured temperature (T$_m$) obtained within 5 seconds of obtaining the measured IDDQ value (IDDQ$_m$); and
    a scaling subsystem operable to scale the measured IDDQ value (IDDQ$_m$) at the measured temperature (T$_m$) to a compensated IDDQ value (IDDQ$_c$) at a desired temperature (T$_d$) using the IDDQ versus temperature model.

2. The IDDQ test system recited in claim 1, further including a binning subsystem operable to sort the specific semiconductor device based upon the compensated IDDQ value (IDDQ$_c$).

3. The IDDQ test system recited in claim 1 wherein the IDDQ versus temperature model is further based upon a quadrilateral approximation of a correlation among IDDQ values measured over a range of temperatures for the given semiconductor device design.

4. The IDDQ test system recited in claim 1 wherein the IDDQ versus temperature model is further based upon an exponential approximation of a correlation among IDDQ values measured over a range of temperatures for the given semiconductor device design.

5. The IDDQ test system recited in claim 4, wherein the exponential approximation is a single point measurement exponential fit approximation.

6. The IDDQ test system recited in claim 5, wherein the single point measurement exponential fit approximation uses an equation:
    (IDDQ$_c$)=(IDDQ$_m$)*C$^{(Td-Tm)}$, wherein C is a calibration coefficient.

7. The IDDQ test system recited in claim 1 wherein the desired temperature (T$_d$) is an target IDDQ binning temperature (T$_t$) for the given semiconductor device design.

8. The IDDQ test system recited in claim 1 wherein the IDDQ versus temperature model is generated in a controlled lab environment.

9. The IDDQ test system recited in claim 1 wherein the measured temperature (Tm) is obtained within about 1 second of obtaining the measured IDDQ value (IDDQ$_m$).

10. The IDDQ test system recited in claim 1 wherein the measured temperature (Tm) is obtained within about 100 milliseconds of obtaining the measured IDDQ value (IDDQ$_m$).

11. A method for binning a semiconductor device, comprising:
    measuring an IDDQ value (IDDQ$_m$) at a measured temperature (T$_m$) for a specific semiconductor device embodying a given semiconductor device design, the measured temperature (T$_m$) obtained within 5 seconds of obtaining the measured IDDQ value (IDDQ$_m$);
    scaling the measured IDDQ value (IDDQ$_m$) at the measured temperature (T$_m$) to a compensated IDDQ value (IDDQ$_c$) at a desired temperature (T$_c$) using an empirically generated IDDQ versus temperature model for the given semiconductor device design; and
    sorting the specific semiconductor device based upon the compensated IDDQ value (IDDQ$_c$).

12. The method recited in claim 11, further including using an empirical extraction subsystem to generate the IDDQ versus temperature model.

13. The method recited in claim 12 wherein the IDDQ versus temperature model is generated based upon a quadrilateral approximation of a correlation among IDDQ values measured over a range of temperatures for the given semiconductor device design.

14. The method recited in claim 12 wherein the IDDQ versus temperature model is generated based upon an exponential approximation of a correlation among IDDQ values measured over a range of temperatures for the given semiconductor device design.

15. The method recited in claim 14, wherein the exponential approximation is a single point measurement exponential fit approximation.

16. The method recited in claim 15, wherein the single point measurement exponential fit approximation uses an equation:
    (IDDQ$_c$)=(IDDQ$_m$)*C$^{(Td-Tm)}$, wherein C is a calibration coefficient.

17. The method recited in claim 11 wherein the measured temperature (Tm) is obtained within about 100 milliseconds of obtaining the measured IDDQ value (IDDQ$_m$).

18. The method recited in claim 11 wherein the desired temperature (T$_d$) is a target IDDQ binning temperature (T$_t$) for the given semiconductor device design.

19. A method for compensating an IDDQ value, comprising:
    empirically extracting an IDDQ versus temperature model for a given semiconductor device design;
    measuring an IDDQ value (IDDQ$_m$) at a measured temperature (T$_m$) for a specific semiconductor device embodying the given semiconductor device design, the measured temperature (T$_m$) obtained within 5 seconds of obtaining the measured IDDQ value (IDDQ$_m$); and
    scaling the measured IDDQ value (IDDQ$_m$) at the measured temperature (T$_m$) to a compensated IDDQ value (IDDQ$_c$) at a desired temperature (T$_d$) using the IDDQ versus temperature model.

20. The method as recited in claim 19 wherein empirically extracting includes using an exponential approximation of a correlation among IDDQ values measured over a range of temperatures for the given semiconductor device design to generate the IDDQ versus temperature model.

* * * * *